United States Patent
Bunin et al.

(10) Patent No.: US 7,523,425 B2
(45) Date of Patent: Apr. 21, 2009

(54) TEST CASE GENERATION ALGORITHM FOR A MODEL CHECKER

(75) Inventors: Grygoriy Bunin, Erlangen (DE); Axel Schneider, Baiersdorf (DE)

(73) Assignee: Alcatel-Lucent USA Inc., Murray Hill, NJ (US)

( * ) Notice: Subject to any disclaimer, the term of this patent is extended or adjusted under 35 U.S.C. 154(b) by 370 days.

(21) Appl. No.: 11/408,506

(22) Filed: Apr. 21, 2006

(65) Prior Publication Data
US 2007/0250799 A1    Oct. 25, 2007

(51) Int. Cl.
*G06F 17/50* (2006.01)
(52) U.S. Cl. .............................. 716/5; 716/4
(58) Field of Classification Search ............ 716/4, 716/5; 703/16; 714/728, 739
See application file for complete search history.

(56) References Cited

U.S. PATENT DOCUMENTS

2006/0010428 A1 *  1/2006  Rushby et al. .............. 717/124

OTHER PUBLICATIONS

Wang F., Gossens S., Haas W., Heinkel U., Generierung von Plänen für die funktionale Verifikation automatenbasierter Entwürfe, Workshop Dresdner Arbeitstagung Schaltungs- und Systementwurf (DASS 2004), Dresden, Apr. 2004.
Wang F., Gossens S., Haas W., Heinkel U., Generierung von Testvorschlägen aus tabellarischen Spezifikationen 16, GI/TG/GMM Workshop "Testmethoden und Zuverlässigkeit von Schaltungen und Systemen", Dresden, Deutschland, 29.02-Feb. 3, 2004.

* cited by examiner

*Primary Examiner*—Vuthe Siek

(57) ABSTRACT

A method for testing hardware and software system design. An abstract system description is used to design hardware/software systems and generated test cases are reused to verify the correctness of the implementation.

20 Claims, 8 Drawing Sheets

| From | To | command = push | stack_pointer < 5 |
|------|------|----------------|-------------------|
| false | true | @ T | T |
| true | false | @ F | T |
| true | false |  | @ F |

FIG. 3

| Next state | push_int | pop_int |
|------------|----------|---------|
| stack_pointer + 1 | @ T | F |
| stack_pointer - 1 | F | @ T |

FIG. 4

```
general_assertions: boolean: =

-- prevent a push operation if the stack is full
if ( fill_level = full ) then
  Next ( command ) /= push
end if and -- prevent a pop operation if the stack is empty
if ( fill_level = empty ) then
  Next ( command ) /= pop
end if;
end general_assertions;
```

FIG. 5

```
theorem P1 is
  assume:
    at t: initial_state;
    at t: stable_state;
    during [ t+0; t+1 ]: general_assertions;

at t+1: command = push;

prove:
    at t+1: fill_level = normal;
end theorem;
```

FIG. 6

```
at t: command = none;
at t+1: command = push;
```

FIG. 7

```
push
getFillLevel normal
```

FIG. 8

```
theorem P2 is
  assume:
    at t: initial_state;
    at t: stable_state;
    during [ t+0; t+x ]: general_assertions;

prove:
    during [ t+0, t+x ]: NOT (( internal_signal1 = value1 ) and ( internal_signal2 = value2 )...)
end theorem;
```

FIG. 9

```
theorem P1 is
  assume:
    at t: stable_state;
    at t: fill_level = full;  -- stack is full at t+1: command = pop;

during [ t+0; t+1 ]: general_assertions;

prove:
    at t+1: fill_level = normal;
end theorem;
```

FIG. 10

```
at t: command = none;
at t+1: command = pop;
```

FIG. 11

```
theorem P2 is
  assume:
    at t: initial_state;
    at t: stable_state;
    during [ t+0, t+10 ]: general_assertions;

prove:
    during [ t+0, t+10 ]: NOT ( fill_level = full );
end theorem;
```

FIG. 12

```
command = none;
command = push;
command = none;
command = push;
command = none;
command = push;
command = none;
command = push;
command = none;
command = push;
```

FIG. 13

```
push
push
push
push
push
pop
get Fill Level normal
```

FIG. 14

```
if ( enabled = true ) then
  NEXT ( request ) /= enable;
end if;
```

FIG. 15

```
theorem P3 is
  assume:
    at t: ( internal_signal1 = value1 ) and
        ( internal_signal2 = value2 ) and ...
    < assume part of P1 > prove:
    NOT < prove part of P1 >
end theorem;
```

FIG. 16

TEST CASE GENERATION ALGORITHM FOR A MODEL CHECKER

FIELD OF THE INVENTION

The present invention generally relates to verification, validation and testing. In particular, the present invention relates to test specification, test case generation, test automation, formal specification, formal verification, and model checking.

BACKGROUND OF THE INVENTION

The verification and validation (V&V) or testing phase of an engineering project is one of the major contributors to the overall development effort and cost of the project. Verification is the process of determining if a system meets the system requirements correctly. Validation is the process of evaluating the system to determine whether it satisfies the specified requirements and meets customer needs. Validation typically takes place after verification is completed. One part of verification and validation is generating test cases. A test case is a set of conditions or variables under which a test procedure determines if a requirement is satisfied. A number of test cases may be necessary to determine that the requirement is fully satisfied.

Past approaches to generating test cases have not been efficient, adding needless effort and cost to projects. In one approach, a verification engineer (a/k/a test engineer) specified tests based on requirements, which a systems engineer typically specified in text documents using natural language and simple graphics. The verification engineer manually specified the test cases by reading and interpreting the requirements, attempting to understand the coherence and interferences between the various requirements, and deriving test cases based on his gathered knowledge. Following the test case specification, the verification engineer wrote test scripts that automated the test cases.

Another approach to generating test cases used formal requirement specification instead of natural language. In this formal methods approach, formal models were generated from the formal requirement specifications and model checkers performed formal verification of the formal requirement specifications. Formal methods are mathematically based techniques (e.g., temporal logic formulas) for the specification, development and verification of software and hardware systems. Formal verification is the act of proving or disproving the correctness of a system with respect to a certain formal specification or property, using formal methods. Formal verification is becoming a key technology to ensure the quality of complex systems (e.g., hardware/software). Today, formal verification is widely used in the design phase of hardware projects. However, formal verification is more or less neglected in software and systems development. Model checking is a method for algorithmically verifying formal systems using a model often derived from a hardware or software design.

One kind of formal methods approach to generating test cases used a model checker called GateProp, which is available from OneSpin Solutions GmbH, Munich. In GateProp, most test cases started from a dedicated state, which was usually different from the initial state of the system (i.e., the "idle" state). The verification engineer specified a particular test case to test a specific aspect of the system that described this aspect, but did not describe how to reach the start state of the test case. This is problematic, because an automated test procedure needs to start from a well-defined idle state. To generate a test case starting from the idle state, it was first necessary to find out how to get from the idle state to the start state of the test case and, second, it was necessary to specify a very complex property for the model checker to generate the needed input sequences. This approach is time-consuming and error-prone. In addition, the generated input sequences contained a large number of unnecessary steps (often greater than 10 times what was required), which increased the runtime of the tests. Even if automated tests ran 24 hours a day, the test coverage achieved during the limited duration of the project was lower than it would have been without these unnecessary steps.

Another approach to generating test cases used model checkers to generate stimuli (inputs) and responses (outputs) for test cases. For example, formal models were generated by using a very high-speed integrated circuit hardware description language (VHDL) and checked by using a commercial VHDL model checker. Other approaches generated test cases from specifications without model checking but by simply determining all combinations or permutations of parameters, input/output signals, etc.

It is difficult—in most cases even impossible—to ensure that the generated test cases cover all requirements of a specific functionality regardless of the approach. For example, in telecommunications, the complexity of the implemented functions, protocols, and their interworking inherently causes this difficulty. In addition, the verification engineer may misinterpret natural language requirements, which themselves may be incomplete or ambiguous. This makes it even more difficult to derive the right test cases to provide sufficient test coverage. Furthermore, it is time consuming for the verification engineer to specify test cases and write test scripts. Test case generation using methods other than model checking typically are slow and create so large a number of test cases that they cannot be executed in a reasonable timeframe.

Accordingly, there is a need for more efficient generation of test cases to help reduce the effort and cost associated with V&V and to improve the time-to-market for project development.

SUMMARY

Exemplary embodiments of the present invention include a test case generation algorithm for a model checker.

One embodiment is a method for test case generation. A first property of a system is verified with a model checker. A second property is automatically generating to reach an initial state of a negation of the first property from an initial state of the system. A debug sequence for the second property is produced. One or more internal signals are added from a last time step of the debug sequence for the second property to an assume part of the negated first property to produce a third property. A final debug sequence is produced using a concatenation of the second and third properties. Another embodiment is a computer readable medium storing instructions for performing this method.

Another embodiment is a system for test case generation, including a model checker and a test case generator. The model checker provides debug sequences. The test case generator uses a debug sequence from the model checker for a first property to automatically create a second property to reach an initial state of the negation of the first property from an initial state of a system. The test case generator adds internal signals from a last time step of the debug sequence for the second property to an assume part of the negated first property to produce a third property. The model checker produces a final debug sequence using a concatenation of the second and third properties.

BRIEF DESCRIPTION OF THE DRAWINGS

The teachings of the present invention can be readily understood by considering the following detailed description in conjunction with the accompanying drawings, in which:

FIG. 3 illustrates a mode transition table (MTT) for an exemplary signal;

FIG. 4 illustrates a data transformation table (DTT) for an exemplary signal;

FIG. 5 illustrates an exemplary macro for preventing erroneous inputs;

FIG. 6 illustrates a first property;

FIG. 7 illustrates an exemplary mapping of input signals to test procedures for the first property of FIG. 6;

FIG. 8 illustrates an exemplary generated test script for the first property of FIG. 6;

FIG. 9 illustrates a second property that starts from the initial state of the system and leads to the initial state of the first property of FIG. 6;

FIG. 10 illustrates another first property that does not start from the initial state of the system;

FIG. 11 illustrates exemplary input signals from a debug sequence generated with the negation of the first property;

FIG. 12 illustrates a second property;

FIG. 13 illustrates the debug sequence generated with the second property of FIG. 12;

FIG. 14 illustrates the executable test scripts generated for the debug sequence of FIG. 13;

FIG. 15 illustrates an exemplary general_assertion macro;

FIG. 16 illustrates a third property that starts from the system state in the last time step of the second property of FIG. 12;

DETAILED DESCRIPTION OF THE INVENTION

The description of the present invention is primarily within a general context of a test case generation algorithm for the model checker called GateProp. However, those skilled in the art and informed by the teachings herein will realize that the invention is generally applicable to other model checkers, to any kind of verification of systems, software, or application specific integrated circuit (ASIC) design and may be applied in many industries, such as telecommunications, semiconductors, automotive, aerospace, military systems, consumer electronics and other industries. Accordingly, the general concepts of the present invention are broadly applicable and are not limited to any particular model checker, verification system, or industry.

Introduction

Verification is one of the most expensive and time-consuming parts of complex system development. Usually verification engineers perform verification using techniques like manual inspection (technical reviews), simulation, and test. Formal verification techniques—in particular model checking—are becoming more widely used to improve the system verification process. For the design of complex hardware devices like ASICs, field-programmable gate arrays (FPGAs) or systems-on-chip, model checking can replace long, expensive simulation runs. Also for software and even for abstract system specifications, model checking can improve system quality and increase the efficiency of verification.

For verification with model checking, a formal language (e.g., temporal logic formulas) describes the properties of a system and proves the properties against a formal model of the system. When one of the properties is not fulfilled, the model checker provides debug information to show how the system fails to meet the property.

If used at all, the application over formal techniques usually stops at this point, and the test cases for verification (by simulation and test) still are manually specified using simple text documents or test specification languages (e.g., testing and test control notation (TTCN-3)). The latter allows automatically generating scripts for test automation, whereas a textual test specification mostly requires manual test script coding. Exemplary embodiments include using model checking to generate the test specification and the corresponding automated test scripts in one seamless flow directly from the system specification.

Figure 1:
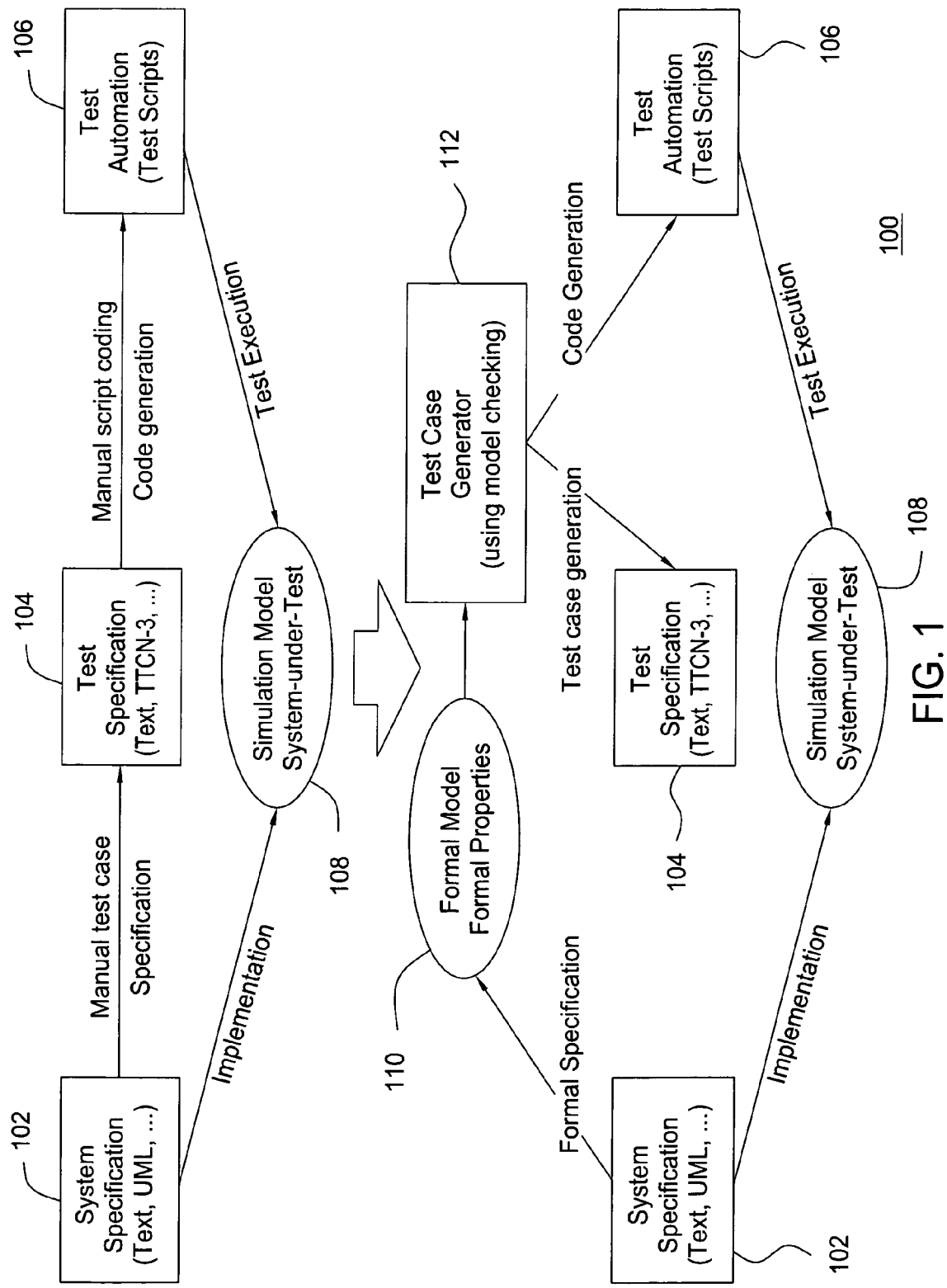
FIG. 1 is a block diagram illustrating the evolution from manual test specification to model checking generated test cases.

FIG. 1 illustrates the evolution from manual test specification to model checking generated test cases. Past approaches include system specification 102 in text, unified modeling language (UML), etc. The verification engineer manually generated a test case specification 104 in text, TTCN-3, etc. and performed manual script coding and code generation for test automation 106 (e.g., test scripts). The system specification 102 was implemented as a simulation model or system-under-test 108 and the test scripts 106 were executed on the simulation model 108. This has evolved to model checking generated test cases. A formal model and formal properties 110 are input to a test case generator 112 using model checking. The formal model 110 is a formal specification generated from the system specification 102. The test case generator 112 generates the test specification 104 and generates code for test automation 106.

Figure 2:
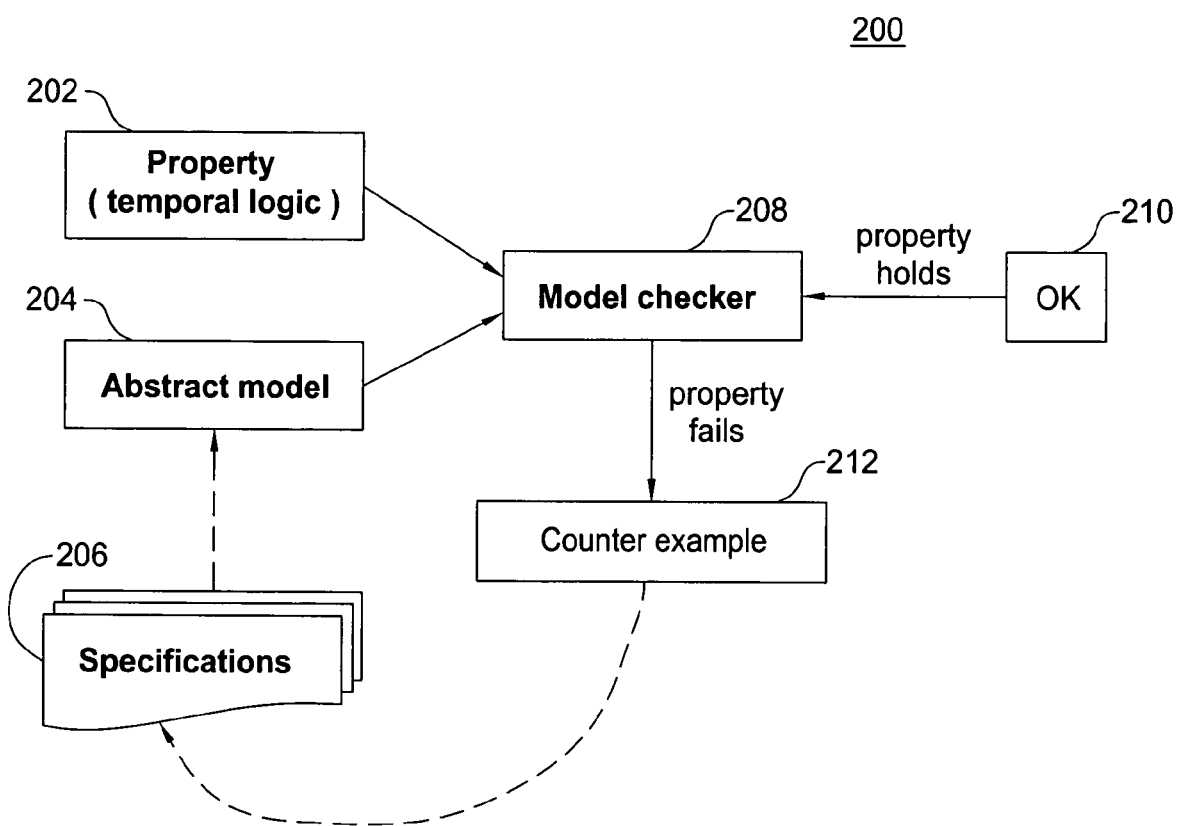
FIG. 2 is a block diagram illustrating an overview of verification with model checking.

FIG. 2 illustrates an overview 200 of verification with model checking. The model checker 208 receives as input the abstract model 204 (e.g., in VHDL) and a property 202 specified in temporal logic that the final (i.e., implemented) system is expected to satisfy. The output of the model checker 208 indicates either that the property holds and the model is okay 210 or that the property fails, in which case a counter-example is generated 212. The counter-example 212 explains in detail why the model does not satisfy the specification. For hardware, model checking is directly applied to the VHDL code. To verify textual system specifications 206 at a high level of abstraction, first the specification needs to be transformed into an abstract model 204.

If the counter-example 212 points out a real failure, then the system specification 206 and the abstract model 204 are corrected and the property 202 is verified again by the model checker 208 to ensure that the abstract model 204 satisfies all the required system properties. This Increases the confidence in the correctness of the abstract model 204 and, thus, in the specification 206 from which the abstract 204 model is derived. This model checking approach finds system failures in the early phases of a system development process and, thus, can significantly shorten the time-to-market.

The Formal Specification Language ADeVA

One embodiment uses a formal specification language called advanced design and verification of abstract systems (ADeVA) and the model checker GateProp. However, the invention is not limited to any particular language and other embodiments use various other formal specification languages. ADeVA is a state/transition based language for system specification. ADeVA was originally designed for ASIC-based systems, but it may be used to specify the control flow of any hardware or software system.

The basic view of the ADeVA paradigm is that the system consists of a set of signals or variables, which are either input signals or driven signals. Input signals receive their values from outside of the system. The dynamic behavior of driven signals is specified by two kinds of tables: mode transition tables (MTTs) and data transformation tables (DTTs). MTTs are intended to reflect the dynamics of control flow while DTTs are especially suited to specifying data value transformations. The chosen semantics enables a straightforward mapping of the specification language to VHDL and, thus, allows existing tools to be used for verification tasks (e.g., the model checker GateProp).

In this embodiment, a SpecEdit tool, which is available from Lucent Technologies, New Jersey, is used to specify a system in the ADeVA language. However, the invention is not limited to any particular tools and other embodiments use various other tools. SpecEdit allows MTTs and DTTs to be edited and data types to be defined. SpecEdit can also generate a behavioral VHDL model from the ADeVA specification, which is needed by the model checker GateProp.

STACK EXAMPLE

To explain the semantics of ADeVA, consider the simple model of a stack. A stack has just one input signal:

command ∈{push, pop, none}.

The driven signals are:

push_int, pop_int ∈{false,true} stack_pointer ∈NATURAL fill_level ∈{empty, normal, full}.

The signal fill_level is also driven to the output of the system.

FIG. 3 illustrates a mode transition table (MTT) for an exemplary signal. This MTT specifies the behavior of the push_int signal for the stack example. Reading the table in FIG. 3 row-wise, the first row means that the signal push_int changes its value from false to true if the condition command=push, because true and the condition stack_pointer<5 is true. In this example, the stack can hold up to five elements. In other words, the signal push_int becomes true if a push operation is requested (command=push) and the stack is not full (stack_pointer<5). The signal changes its value from true to false if the condition command=push becomes false and the condition stack_pointer<5 is true (second row). The third row expresses that the signal push_int changes its value from true to false if the condition stack_pointer<5 becomes false. The '−' in the third row means that the current value of the condition command=push does not matter for this state transition. The behavior of the pop_int signal is similar. The behavior of the stack_pointer signal is better described with a DTT as shown in FIG. 4.

FIG. 4 illustrates a data transformation table (DTT) for an exemplary signal. The first row in FIG. 3 means that the signal stack_pointer is incremented if the signal push_int becomes true and pop_int is false. It is decremented if pop_int becomes true and push_int is false. One difference between an MTT at a DTT is that for a DTT the current state of the signal does not matter. A DTT is also used for the fill_level signal. An example of a row in this DTT is that the signal fill_level becomes full if the condition stack_pointer=5 becomes true. This stack model example is simplified (e.g., the stack does not hold any data). Of course, there are other possible ways of modeling a stack.

Test Case Generation with GateProp

One exemplary embodiment generates test cases using a model checker, such as GateProp. GateProp allows a verification engineer to specify properties with an interval time language (ITL), which uses a VHDL syntax (called VHI) or Verilog syntax (called VHI). Each specified property has two parts: an assume part and a prove part. For each property, the verification engineer specifies a number of assumptions in the assume part and specifies a number of commitments in the prove part. GateProp attempts to prove the commitments under the conditions specified by the assumptions for the property.

The verification engineer specifies a property of the system that he wants to formally verify against a model of the specification. Later, the verification engineer tests the implemented (real) system. For pedagogic reasons, assume for now that the property starts from the initial state of the system, i.e., the assume part is specified as follows.

at t: initial_state;

at t: stable_state;

where initial_state is a macro that sets all internal signals as well as outputs to some predefined values. The stable_state macro sets all input signals to the values that do not allow any system state changes. For the stack example, this would be command=none. The stable_state macro is required in an asynchronous modeling approach. Without this macro GateProp can, for example, choose the value push for the input signal command in the first time step. However, the push operation will not be done, because no signal event for the command signal is detected. Using the stable_state macro, sets the value of command to none in the first time step. In the second time step, GateProp can choose the value push. Then a signal event is detected (i.e., the command changes its value from none to push) and the push operation is performed.

After verifying the property with GateProp, the property is negated. That is, every commitment in the prove part of the property is negated. For example, if the property contains 'enable=1' as a commitment in the prove part, the negated property will contain 'NOT(enable=1)' or '(enable≠1)'. The assumptions in the assume part of the property are left unchanged. Then, the negated property is passed to GateProp. Because the original property holds, the negated property always fails and GateProp provides a debug sequence. Considering only the input signals, the resulting complete input sequence leads from the initial state of the system to the desired state specified in the prove part of the original property.

To create an executable test script the input signals are mapped to a set of existing test procedures. In the simplest case, exactly one test procedure is used for one input signal. However, in general, it may happen that several procedures are needed for one input signal or several signals must be mapped to one test procedure. Arbitrary N:M mappings are also possible. For this reason, one exemplary embodiment includes a tool that allows entering and editing the mapping of input signals to existing test procedures. In this embodiment, the test case generator uses a database created by this tool to map the input signals extracted from the debug sequence to the existing test procedures.

After mapping the input signals to the test procedures, some retrieval procedures are appended to the end of the test script to retrieve the current values of the output signals. These values can be compared to values of the output signal of a debug sequence. If they are different, then the system behavior does not meet the requirements and the test case fails.

Preventing Erroneous Inputs

To some input sequences that can lead to an error during the test script execution, a macro can be defined once for a system and reused in every property. In the stack example, these inputs are: a push operation (i.e., command=push) if the stack is full; and a pop operation (i.e., command=pop) if the stack is empty.

FIG. 5 shows an exemplary macro for preventing erroneous inputs. The NEXT operator refers to the value of the signal in the next time step, e.g., if the stack is full in the current time step, the command signal in the next time step must not be push. This macro is used for all-time steps in each property that is intended for the test case generation:

during[t+0; t+x]: general_assertions;

Note that for a push operation on the full stack, the model would behave correctly (i.e., push_int would not become true and no push operation would occur), but the test case generator would map the input signal command=push to a test procedure that would try to do a push operation. This would probably cause an error.

EXAMPLE

FIG. 6 illustrates a first property, P1, which is a very simple example of a property that starts from the initial state of the system. In the property, we want to check that the fill level of the stack changes to normal after a push operation in the initial state, where the stack is empty. The general_assertions macro (see FIG. 5) is not required for this particular property, but it does no harm to use it anyway. The negated property !P1 contains NOT(fill_level=normal) in the prove part. Considering only the input signals from the debug sequence (in this case, only the command signal) generated with the property !P1 results in FIG. 7.

FIG. 7 illustrates an exemplary mapping of input signals to test procedures for the first property of FIG. 6. These input signals are now mapped to test procedures. For command=none, there is no need to call any test procedures for command=push, merely to call one test procedure, push, with no arguments. This information is taken from the mapping database. To retrieve the expected output values (i.e., fill_level=normal), the retrieve procedure getFillLevel is called with parameter normal. In other words, it is expected that the fill level will be normal. The information about what retrieval procedures must be called to retrieve an output value is stored in the database, in one embodiment. The generated test script is shown in FIG. 8.

FIG. 8 illustrates an exemplary generated test script for the first property of FIG. 6.

Properties that Start from Some Arbitrary State

Up to this point, it was assumed that the property used for the test case generation always starts from the initial state of the system. It would be a big drawback to require that all properties must start from the initial state. Assume that the property P1 starts from some arbitrary state. The approach described above results in a debug sequence that leads from some arbitrary state of the system defined in the assume part of the property P1 to the desired state. However, each test case should start from the initial state of the system. To reach the initial state of the property P1 another property P2 is used that starts from the initial state of the system and leads to the initial state of the property P1. The automatically generated property P2 will always be what is illustrated in FIG. 9.

FIG. 9 illustrates a second property P2 that starts from the initial state of the system and leads to the initial state of the first property P1 of FIG. 6. Starting from the initial and stable state of the system, again, the general_assertions macro is used to prevent some inputs that would lead to an error during execution of the generated test script. The signals and values of the prove part of the property described the initial state of the property P1. In a majority of cases, these are the signals from the assume part of the property P1. Because the debug sequence generated by GateProp will mostly contain all internal signals, the verification engineer additionally specifies the relevant signals, whose values will be reached with the property P2. The test case generator extracts the values of these signals from the first time step of the debug sequence of the property !P1 (i.e., negated P1) and puts them to the prove part of the property P2, so that the property P2 is generated automatically.

Another issue associated with automatically generating the property P2 is choosing a matching value for x in the during commitment. Because there is no way in the ITL used by GateProp to express that some states have to be reached no matter how many time steps are required, the verification engineer must specify the maximal time step number x. Therefore, he needs to estimate how many time steps are approximately required to reach the initial state of the property P1 from the initial state of the system. In a doubtful case, it is better to choose more time steps than are actually needed. If too few time steps are chosen and the desired state can not be reached, GateProp will provide no debug sequence (i.e., the property P2 holds) and the test case generator will return an error. The verification engineer can then increase the maximal time step number and run the test case generation again. Choosing too many time steps will not produce an error, but might cause GateProp to run into a state space explosion problem.

After concatenating the debug sequences produced with the properties P2 and !P1, a complete input sequence that leads from the initial state of the system to the desired state is defined in the prove part of the property P1.

FIG. 10 illustrates another first property P1 that does not start from the initial state of the system. This property starts from a state where the stack is full (i.e., fill_level=full). In the next time step, a pop operation is performed and it is expected that the fill level of the stack will change to normal.

FIG. 11 illustrates exemplary input signals from a debug sequence generated with the negation of the first property !P1.

Additionally, the verification engineer specifies the relevant internal signals, which values should be reachable from the initial state of the system. In this case, it is just the fill_level signal and the approximate number of time steps to do it (e.g., 10 time steps are enough to fill the stack with 5 elements). Having this information, the test case generator automatically generates the property P2 as illustrated in FIG. 12. The debug sequence produced with this property is illustrated in FIG. 13.

After concatenating this sequence with the input sequence generated with the property !P1, the complete input sequence is obtained. The complete input sequence leads from the initial state of the system to the desired state defined in the prove part of the property P1. After mapping the signals to test procedures and adding the desired retrieval, the executable test script illustrated in FIG. 14 is obtained.

For larger models with many internal signals, it is possible that the general_assertions macro cannot prevent all of the input signal combinations that would lead to an error during the execution of the generated test script. To demonstrate this issue, assume the system model has an input signal, request, an internal (driven) signal enabled as well as some other input and internal signals. One requirement is that enabled becomes true if request changes its value to enable. After that, the input signal request may become none or disable, but not enable again. To prevent this, we can use the general_assertions macro illustrated in FIG. 15.

This assertion will be used in both properties P1 and P2. Assume that the property P1 does not have any conditions related to the signal enabled in the assume part. This means that GateProp is free to choose any allowed state for this signal. Assume that the chosen value is false. Thus, in the next time step, GateProp may decide to assign the value enable to the input signal request and enabled becomes true. However, it is also possible that the (automatically generated) property P2 will leave the system in a state where enabled=true. After concatenating the both debug sequences, an input sequence is obtained where request is set to enable twice, without setting it to disable in between. This will cause an error in the generated test script. The general_assertions macro prevents this incorrect behavior during the property P1 and P2, but it cannot prevent it in the final sequence, because the property P1 does not know the system state at the end of the property P2.

To correct this behavior, a third property P3 is generated that starts from the system state in the last time step of the property P2. The prove part of P3 contains the same commitments as the property !P1, as illustrated in FIG. 16. To obtain the final input sequence, the debug sequence generated with P2 is concatenated with the debug sequence generated with P3. Another advantage of this approach is that the initial state of the property P3 is guaranteed to be reachable, because it is the last system state of the property P2. Using !P1 instead of P3, it is not possible that GateProp will choose a system state that is not reachable from the initial state of the system.

Algorithm Overview

Figure 17:
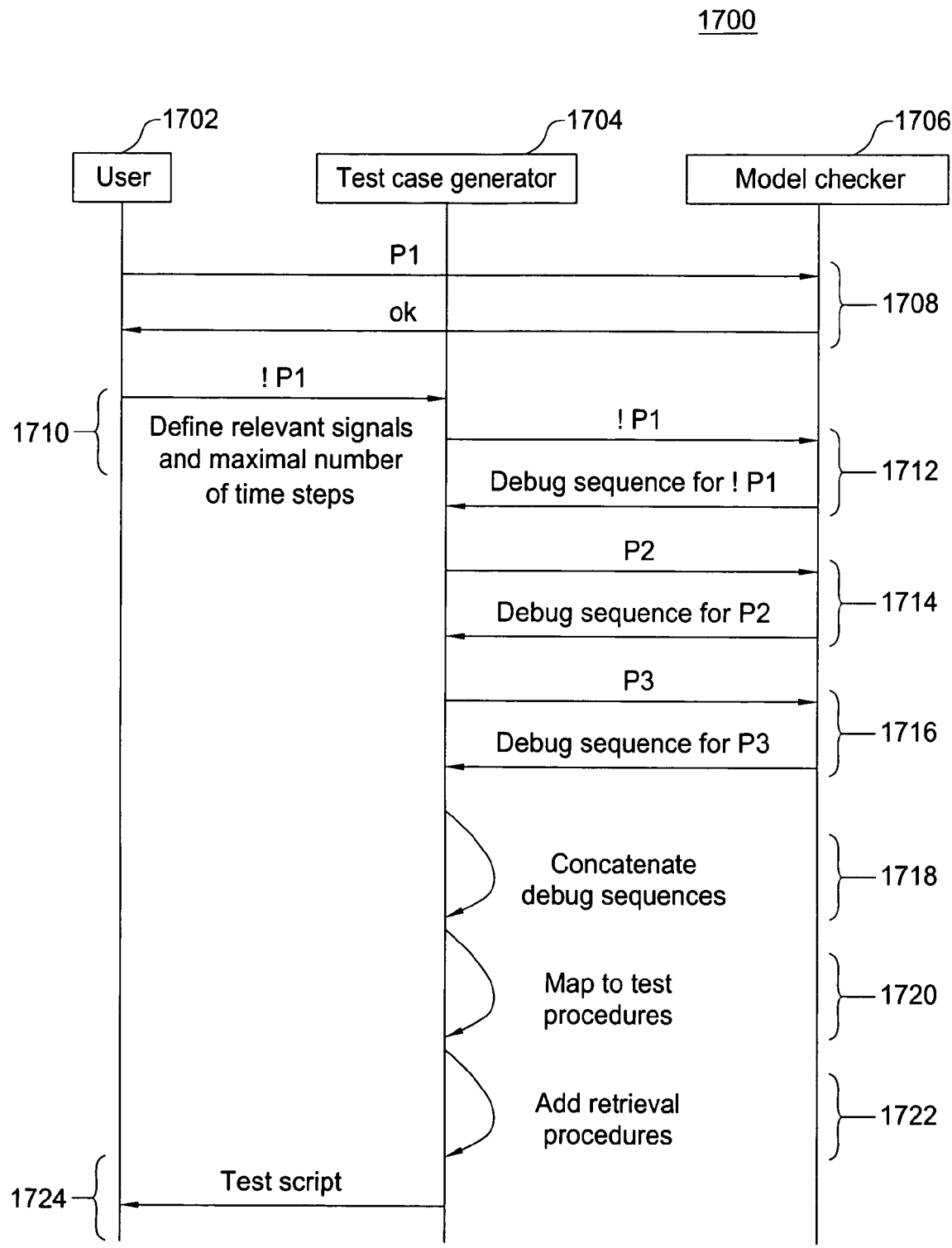
FIG. 17 is a message sequence chart illustrating an exemplary method of test case generation.

FIG. 17 is a message sequence chart illustrating an exemplary embodiment of a test case generation algorithm 1700. A user 1702 (e.g., verification engineer), a test case generator 1704, and a model checker 1706 participate in the method 1700.

1. The verification engineer specifies a property P1 of the system and verifies it with GateProp. (Step 1708)
2. If the property P1 holds, the verification engineer negates P1 (or P1 may be negated automatically) and specifies the relevant internal states and maximal time step number as described above. (Steps 1708 and 1710)
3. The negated property !P1 is passed to GateProp and will always fail. (Step 1712)
4. The test case generator uses the first time step of the produce debug sequence to automatically create a new property P2 to reach the initial state of the property !P1 from the initial state of the system (Only if !P1 does not already start with the initial state of the system). (Step 1714)
5. The internal signals from the last time step of the debug sequence from the property P2 are added to the assume part of the property !P1, resulting in property P3. (Step 1716)
6. The debug sequences produced with the properties P2 and P3 are concatenated. (Step 1718)
7. The input signals from the overall debug sequence are mapped to the test procedures using the existing database. (Step 1720)
8. Retrieval procedures are appended to the end of the test case to retrieve the current value of some output signals and to compare them to the expected values in the last time step of the debug sequence. The test case is successful, if they retrieve values are equal to the expected values; otherwise, the test case fails. (Steps 1722 and 1724)

This exemplary embodiment generates test cases using a model checker 1706, such as GateProp, for an abstract model of a specification and a test case generator 1704. The abstract model may be described with the ADeVA language using tables, such as MTTs and DTTs or another model language, such as VHDL. Properties of the abstract model are selected for test case generation and specified using a property specification language, such as ITL for GateProp.

Prior approaches for generating test case input and output sequences (stimuli/responses) suggested using one execution run of the model checker. However, experiments showed that this does not lead to the intended results. For this purpose, exemplary embodiments were developed with three runs of the model checker. The property for the first run was created by manually specifying what was to be tested. This property could start at any state of the system. The properties for the following runs of the model checker were created automatically by using the result of the former run. The second run was required to generate the sequence for getting the system from its idle state to the start of the test case. The third run was executed to eliminate undesirable steps from the test case input sequence.

Therefore, exemplary embodiments use the model checker GateProp to efficiently generate test cases from the ADeVA models and, in general, from any VHDL models (because internally ADeVA is transformed into behavioral VHDL). Generating test cases instead of manually writing the test scripts saves test automation effort and, thus, enables the verification engineer to significantly increase his test coverage and the overall quality. Furthermore, exemplary embodiments make it possible to easily generate test cases for scenarios that are not obvious from the specification, especially if the states to be tested are very deep in the state space. The principle of first verifying a property against the specification and thereafter using this property for generating a test case automatically from the specification ensures that the test case tests what it is intended to test, whereas manual test automation scripting is error-prone. Finally, compared to other methods for test case generation, exemplary embodiments of the algorithm are very fast. In experiments, a model checker run typically lasted a few seconds and performing steps 3 to 8 of the algorithm, including script generation, took a few minutes. From a business perspective, the invention helps to improve quality to reduce development costs and to speed up time-to market. Anyone who needs to verify a system software or ASIC design by simulation and or test would benefit from the invention in combination with a model checker, such as GateProp. A model checker in combination with the invention would have a significant advantage by extending a verification tool environment by a test case generation facility.

Figure 18:
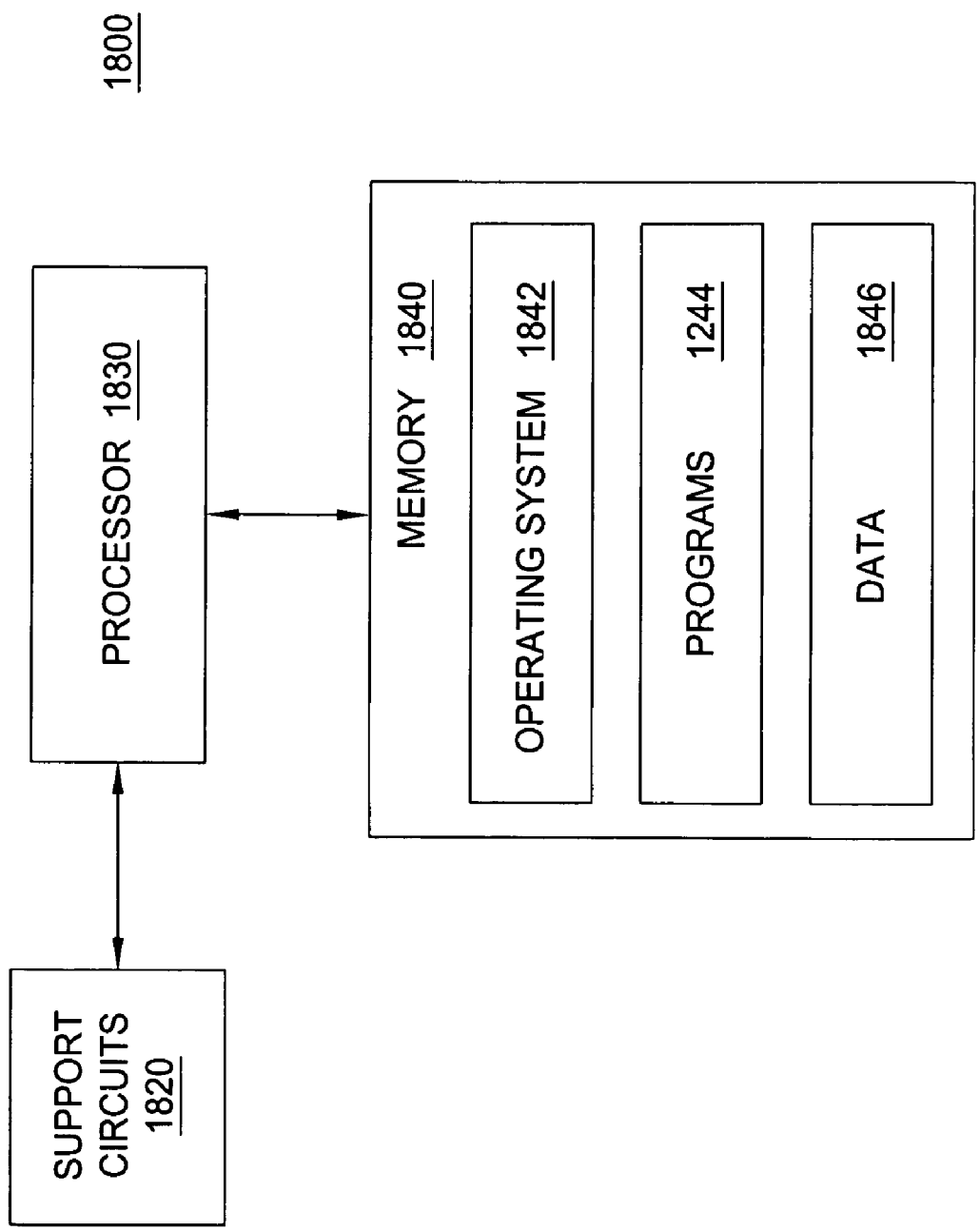
FIG. 18 is a high-level block diagram showing a computer. To facilitate understanding, identical reference numerals have been used, where possible, to designate identical elements that are common to the figures.

FIG. 18 is a high-level block diagram showing a computer. The computer 1800 may be employed to implement embodiments of the present invention. The computer 1800 comprises a processor 1830 as well as memory 1840 for storing various programs 1844 and data 1846. The memory 1840 may also store an operating system 1842 supporting the programs 1844.

The processor 1830 cooperates with conventional support circuitry such as power supplies, clock circuits, cache memory and the like as well as circuits that assist in executing the software routines stored in the memory 1840. As such, it is contemplated that some of the steps discussed herein as software methods may be implemented within hardware, for example, as circuitry that cooperates with the processor 1830 to perform various method steps. The computer 1800 also contains input/output (I/O) circuitry that forms an interface between the various functional elements communicating with the computer 1800.

The present invention may be implemented as a computer program product wherein computer instructions, when processed by a computer, adapt the operation of the computer such that the methods and/or techniques of the present invention are invoked or otherwise provided. Instructions for invoking the inventive methods may be stored in fixed or removable media, transmitted via a data stream in a broadcast media or other signal-bearing medium, and/or stored within a working memory within a computing device operating according to the instructions.

While the foregoing is directed to various embodiments of the present invention, other and further embodiments of the invention may be devised without departing from the basic scope thereof. As such, the appropriate scope of the invention is to be determined according to the claims, which follow.

What is claimed is:

1. A method for test case generation, comprising:
   verifying a first property of a system with a model checker;
   automatically generating a second property to reach an initial state of a negation of the first property from an initial state of the system;
   producing a debug sequence for the second property;
   adding at least one internal signal from a last time step of the debug sequence for the second property to an assume part of the negated first property to produce a third property; and
   producing a final debug sequence by concatenating the second and third properties.

2. The method of claim 1, further comprising:
   defining a maximal number of time steps.

3. The method of claim 1, further comprising:
   producing a debug sequence for the negated first property.

4. The method of claim 1, further comprising:
   producing a debug sequence for the third property.

5. The method of claim 1, further comprising:
   mapping a plurality of input signals from the final debug sequence to at least one test procedure.

6. The method of claim 5, further comprising:
   adding at least one retrieval procedure to the test procedure.

7. The method of claim 1, further comprising:
   providing a test script.

8. A system for test case generation, comprising:
   a model checker for providing a plurality of debug sequences; and
   a test case generator for using a debug sequence from the model checker for a first property to automatically create a second property to reach an initial state of a negation of the first property from an initial state of a system;
   wherein the test case generator adds at least one internal signal from a last time step of the debug sequence for the second property to an assume part of the negated first property to produce a third property; and
   wherein the model checker produces a final debug sequence by concatenating the second and third properties.

9. The system of claim 8, wherein the test case generator receives a maximal number of time steps.

10. The system of claim 8, wherein the model checker verifies the first property and produces a debug sequence for the negated first property.

11. The system of claim 8, wherein the model checker produces a debug sequence for the third property.

12. The system of claim 8, wherein the test case generator maps a plurality of input signals from the final debug sequence to at least one test procedure.

13. The system of claim 12, wherein the test case generator adds at least one retrieval procedure to the test procedure.

14. The system of claim 8, wherein the test case generator provides a test script.

15. A computer storage device having stored thereon instructions that when executed perform a method for test case generation, the method comprising:
   verifying a first property of a system with a model checker;
   automatically generating a second property to reach an initial state of a negation of the first property from an initial state of the system;
   producing a debug sequence for the second property;
   adding at least one internal signal from a last time step of the debug sequence for the second property to an assume part of the negated first property to produce a third property; and
   producing a final debug sequence by concatenating the second and third properties.

16. The computer storage device of claim 15, wherein the method further comprises:
   defining a maximal number of time steps.

17. The computer storage device of claim 15, wherein the method further comprises:
   producing a debug sequence for the third property.

18. The computer storage device of claim 15, wherein the method further comprises:
   mapping a plurality of input signals from the final debug sequence to at least one test procedure.

19. The computer storage device of claim 15, wherein the method further comprises:
   adding at least one retrieval procedure to the test procedure.

20. The computer storage device of claim 15, wherein the method further comprises:
   providing a test script.

* * * * *